(12) United States Patent
Bae

(10) Patent No.: US 11,450,898 B2
(45) Date of Patent: Sep. 20, 2022

(54) BATTERY MONITORING MODULE

(71) Applicant: SAMSUNG SDI CO., LTD., Yongin-si (KR)

(72) Inventor: Jincheol Bae, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 309 days.

(21) Appl. No.: 16/870,107

(22) Filed: May 8, 2020

(65) Prior Publication Data

US 2020/0358142 A1  Nov. 12, 2020

(30) Foreign Application Priority Data

May 10, 2019 (KR) .......................... 10-2019-0055139

(51) Int. Cl.
| | |
|---|---|
| *H01M 10/42* | (2006.01) |
| *H01M 10/44* | (2006.01) |
| *H02J 7/00* | (2006.01) |
| *G01R 31/3835* | (2019.01) |

(52) U.S. Cl.
CPC .... *H01M 10/4264* (2013.01); *G01R 31/3835* (2019.01); *H01M 10/44* (2013.01); *H02J 7/0016* (2013.01); *H02J 7/0047* (2013.01); *H01M 2010/4271* (2013.01)

(58) Field of Classification Search
CPC .......... H01M 10/4264; H01M 10/425; H01M 10/4257; H01M 10/44; H01M 10/441; H01M 10/446; H01M 2010/4271; G01R 31/3835; G01R 31/3842; G01R 31/382; H02J 7/0016; H02J 7/0047
See application file for complete search history.

(56) References Cited

U.S. PATENT DOCUMENTS

| | | | |
|---|---|---|---|
| 2014/0152261 A1 | 6/2014 | Yamauchi et al. | |
| 2015/0349388 A1* | 12/2015 | Haering | H01M 10/4257 29/623.2 |
| 2017/0214255 A1* | 7/2017 | Hartmann | H01M 10/482 |
| 2017/0279160 A1* | 9/2017 | Kim | H01M 50/394 |

FOREIGN PATENT DOCUMENTS

| | | |
|---|---|---|
| JP | 2018-50454 A | 3/2018 |
| KR | 10-1500547 B1 | 3/2015 |

* cited by examiner

*Primary Examiner* — Raymond Alejandro
(74) *Attorney, Agent, or Firm* — Lee IP Law, P.C.

(57) ABSTRACT

A battery monitoring module includes a printed circuit board including a first signal line, a second signal line, and a conductive pad, the conductive pad being configured to be connected to an electrode of a cell; an integrated circuit on the printed circuit board, the integrated circuit to measure a cell voltage at the cell and control cell balancing; a measuring interface on the printed circuit board and connected between the conductive pad and the integrated circuit, and providing a voltage measuring path; and a balancing circuit on the printed circuit board and connected between the conductive pad and the integrated circuit, the balancing circuit providing a discharge path for the cell. The first signal line may electrically connect the conductive pad to the measuring interface, and the second signal line may be physically separated from the first signal line, and electrically connect the conductive pad to the balancing circuit.

9 Claims, 8 Drawing Sheets

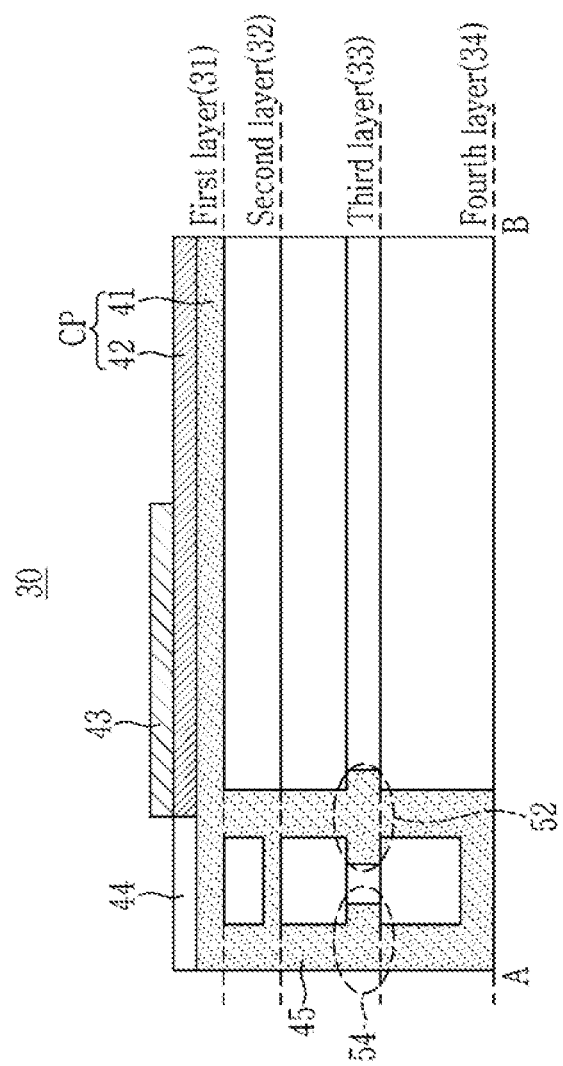

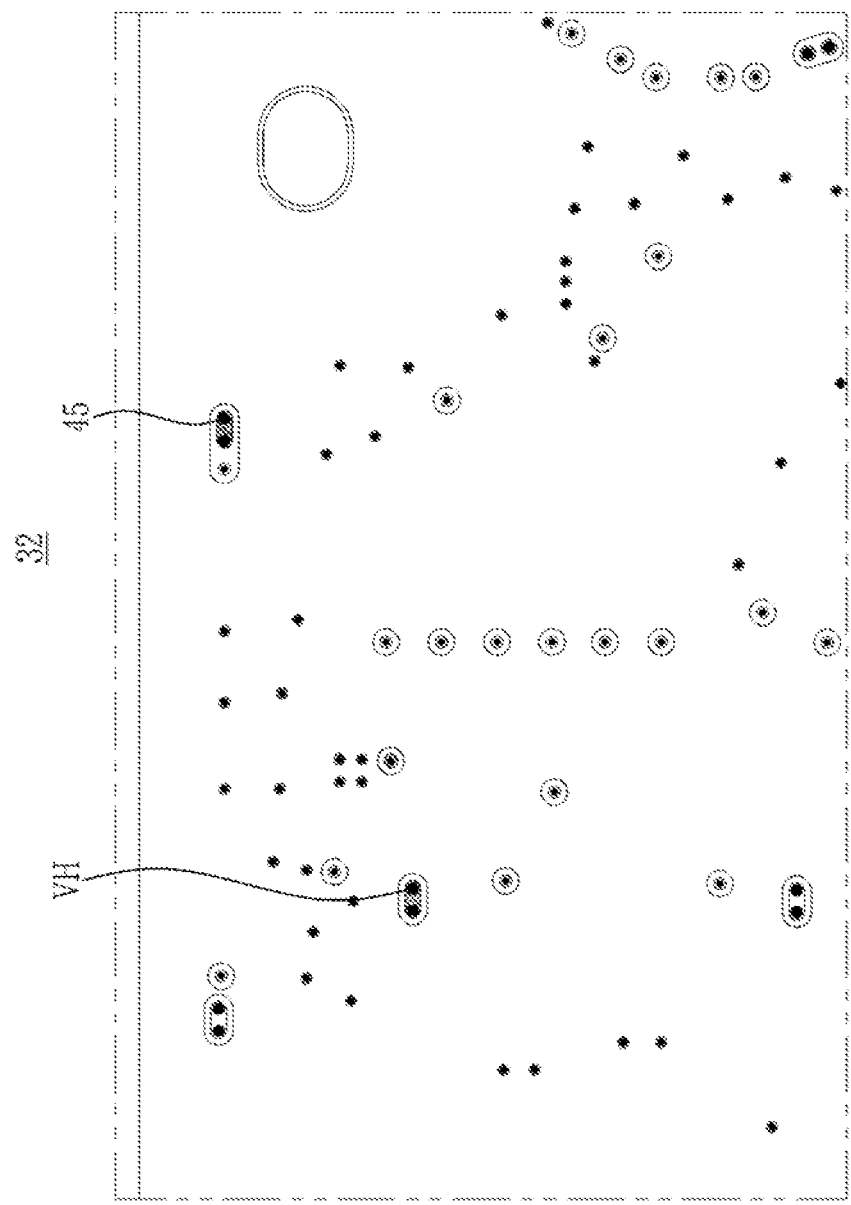

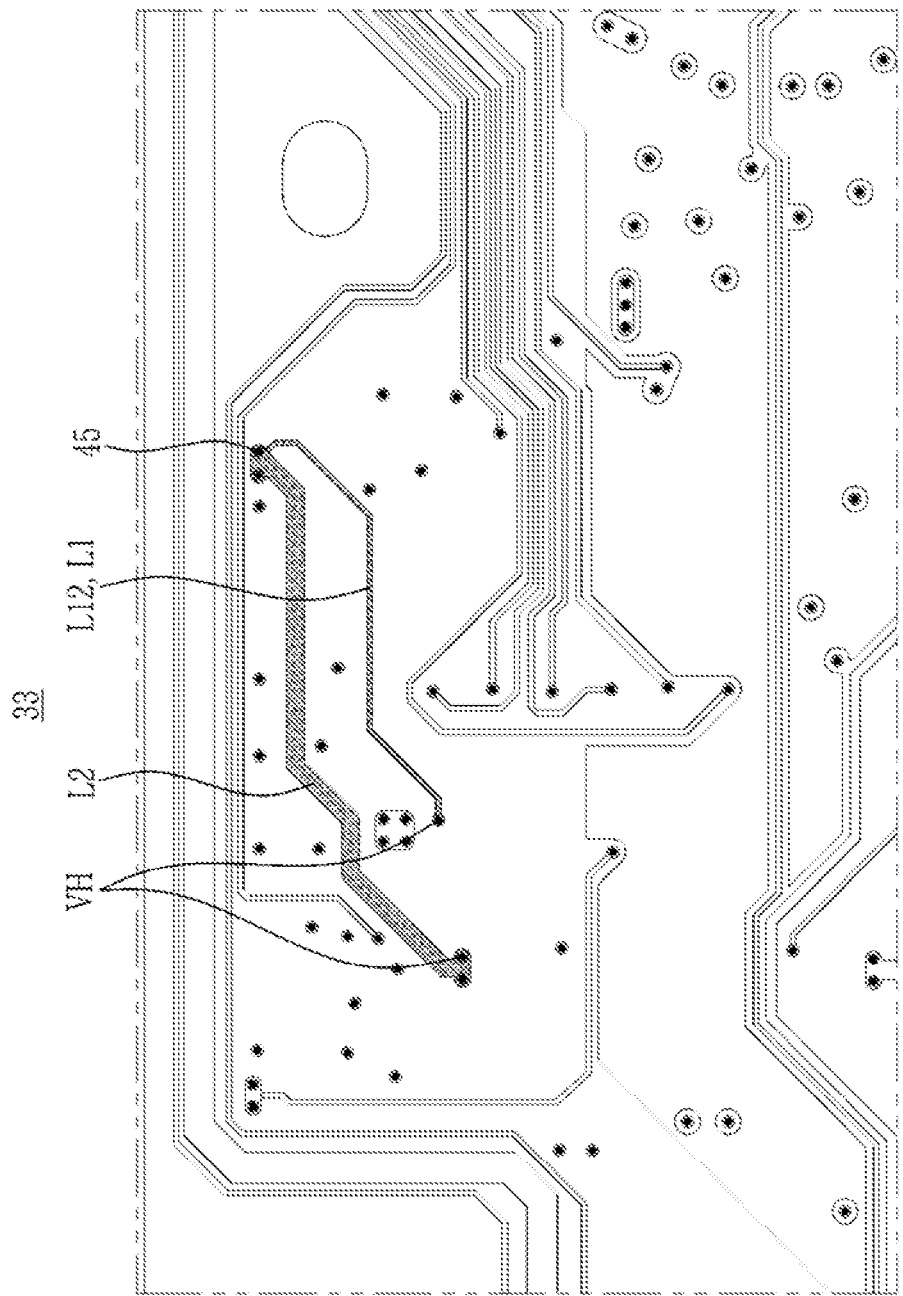

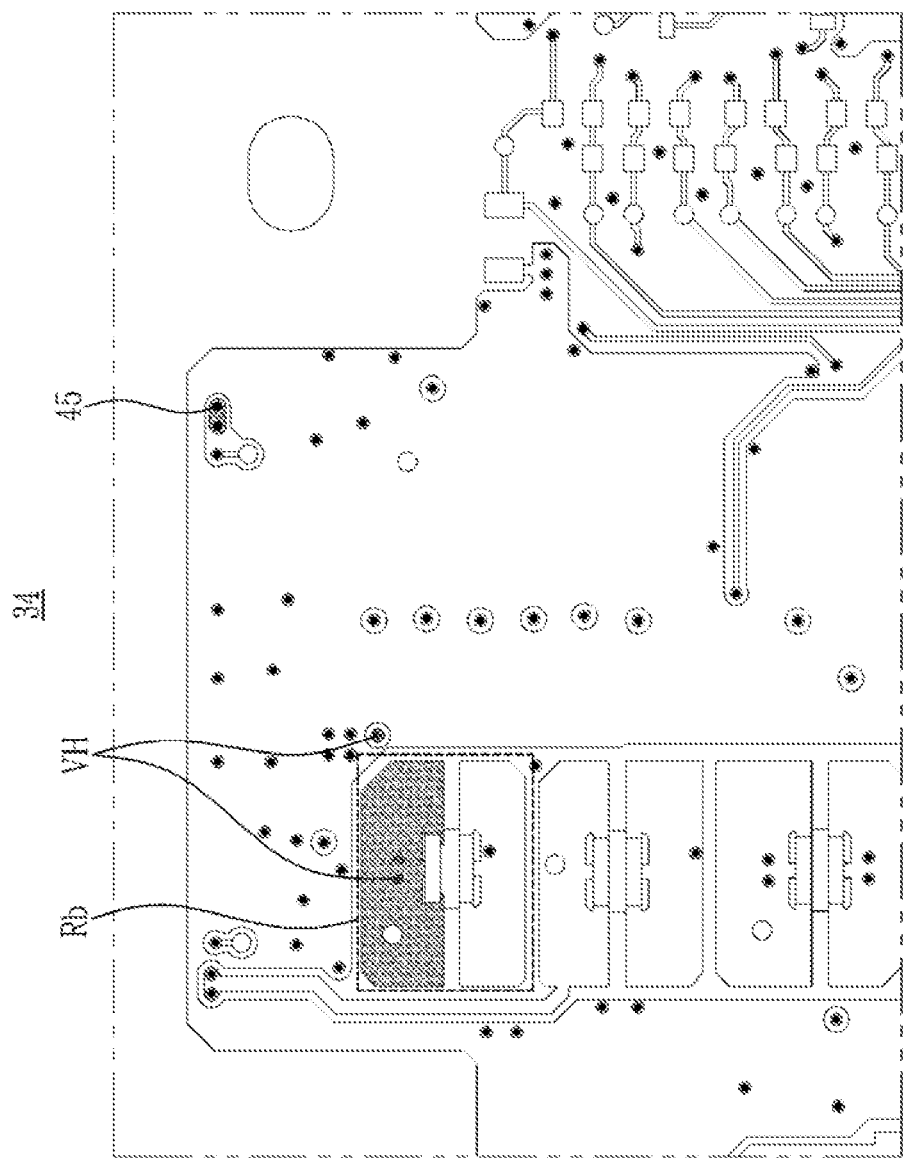

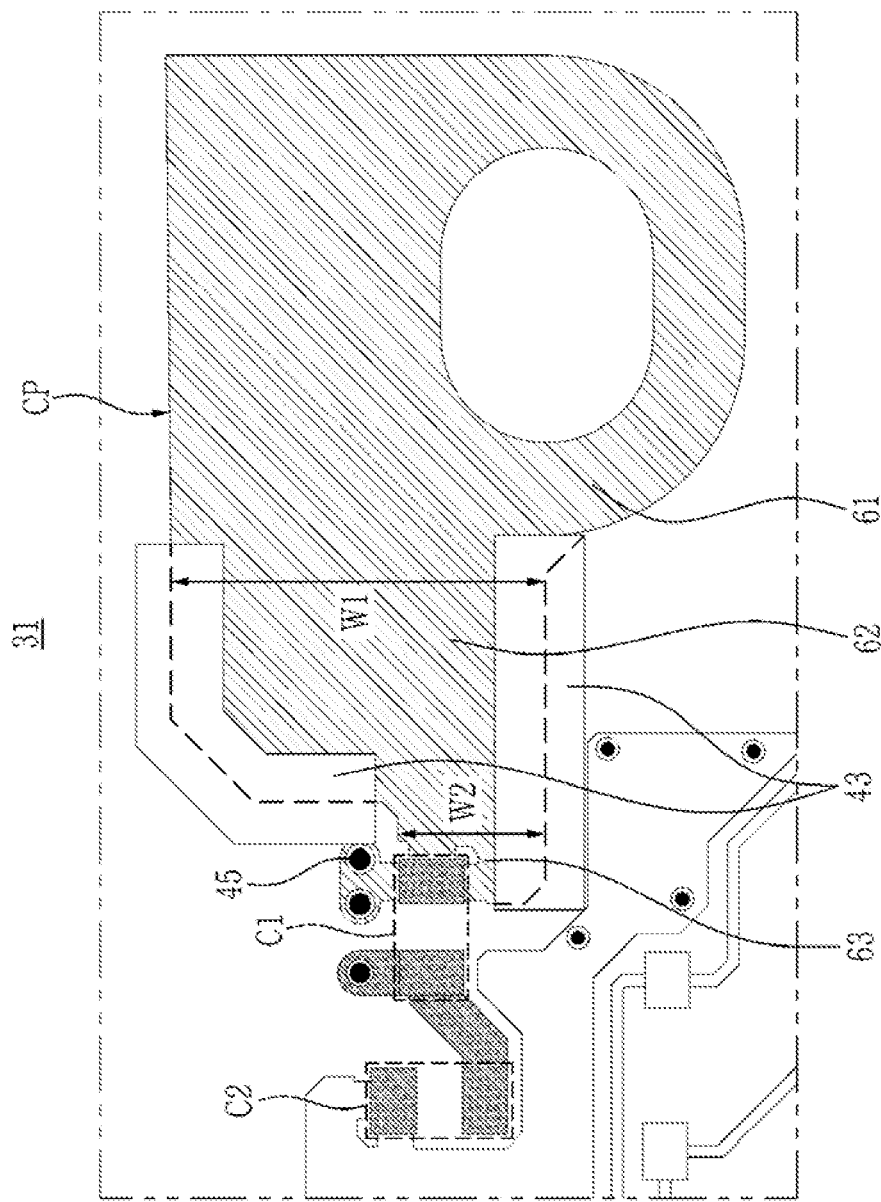

BATTERY MONITORING MODULE

CROSS-REFERENCE TO RELATED APPLICATION

Korean Patent Application No. 10-2019-0055139 filed on May 10, 2019 in the Korean Intellectual Property Office entitled: "Battery Monitoring Module," is incorporated by reference herein in its entirety.

BACKGROUND

1. Field

Embodiments relate to a battery monitoring module.

2. Description of the Related Art

A battery pack may include a plurality of battery modules. The battery modules may each include a plurality of cells connected together. A battery management system (BMS) may be included in the battery pack.

The above information disclosed in this Background section is only for enhancement of understanding of the background of the related art, and therefore it may contain information that does not form the prior art that is already known in this country to a person of ordinary skill in the art.

SUMMARY

Embodiments are directed to a battery monitoring module, including a printed circuit board including a first signal line, a second signal line, and a conductive pad, the conductive pad being configured to be connected to an electrode of a cell; an integrated circuit on the printed circuit board, the integrated circuit being configured to measure a cell voltage at the cell and to control cell balancing of the cell; a measuring interface on the printed circuit board and connected between the conductive pad and the integrated circuit, the measuring interface providing a voltage measuring path for the cell; and a balancing circuit on the printed circuit board and connected between the conductive pad and the integrated circuit, the balancing circuit providing a discharge path for the cell during the cell balancing. The first signal line may electrically connect the conductive pad to the measuring interface, and the second signal line may be physically separated from the first signal line, and electrically connect the conductive pad to the balancing circuit.

The battery monitoring module may further include an electrostatic discharge capacitor on the printed circuit board and electrically connected to the conductive pad.

The conductive pad may include a first part connected to an electrode of the cell, a second part, and a third part to which the electrostatic discharge capacitor is connected, and the second part may connect the first part and the third part, and may have a shape in which a width of the second part gradually reduces in a direction from the first part toward the third part.

The first and second signal lines may be combined with a portion of the third part, and the electrostatic discharge capacitor may be provided on the printed circuit board between the second part and the portion of the third part where the first and second signal lines are connected.

The printed circuit board may further include an anticorrosive member positioned on at least part of edges of the second part and the third part.

The anticorrosive member may include a coating film formed by a silkscreen printing way.

The measuring interface may include a resistor on the printed circuit board, the resistor including a first terminal electrically connected to the first signal line, and a second terminal connected to a voltage measuring input terminal of the integrated circuit.

The balancing circuit may include a balancing resistor for discharging electrical energy of the cell, the balancing resistor being on the printed circuit board and including a first terminal electrically connected to the second signal line.

The printed circuit board may include at least one via hole electrically connecting at least two of the conductive pad, the integrated circuit, the measuring interface, the balancing circuit, the first signal line, and the second signal line, and the via hole may be filled with a filler made of an insulating material by a hole plugging operation.

BRIEF DESCRIPTION OF THE DRAWINGS

Features will be apparent to those of skill in the art by describing in detail example embodiments with reference to the attached drawings in which:

FIG. 3 shows a cross-sectional view of a printed circuit board of a battery monitoring module according to an example embodiment.

FIG. 4A to FIG. 4D show plan views of a printed circuit board of a battery monitoring module for respective layers according to an example embodiment.

FIG. 5 shows an example of coupling of an ESD capacitor to a conductive pad on a printed circuit board of a battery monitoring module according to an example embodiment.

DETAILED DESCRIPTION OF THE EMBODIMENTS

Figure 1:
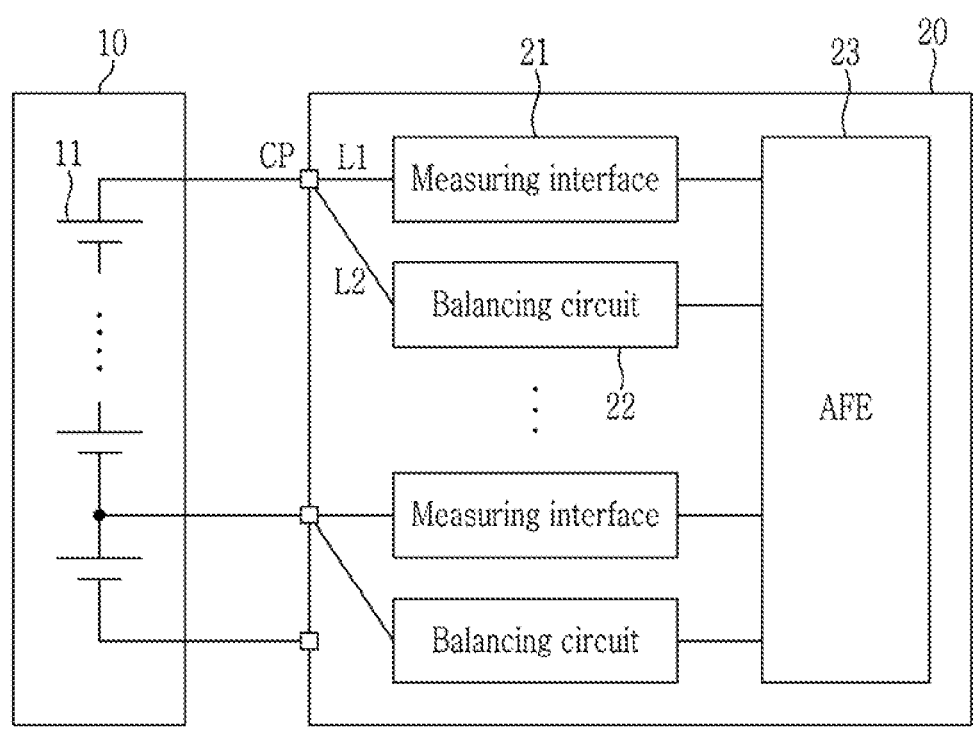
FIG. 1 shows a block diagram of a battery monitoring circuit for configuring a battery monitoring module according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawing figures, the dimensions of layers and regions may be exaggerated for clarity of illustration. Like reference numerals refer to like elements throughout.

Electrically connecting two constituent elements includes directly connecting two constituent elements and connecting the same with another constituent element therebetween. The other constituent element may include a switch, a resistor, and a capacitor. When the example embodiments are described, an expression of connection signifies electrical connection when an expression of direct connection is not provided.

A battery monitoring module according to an example embodiment will now be described with reference to accompanying drawings.

Figure 2:
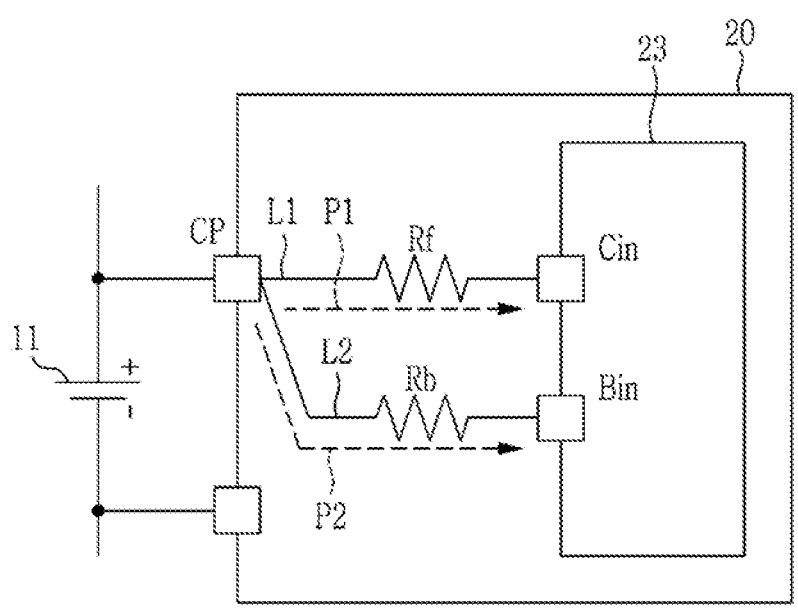
FIG. 2 shows a circuit diagram of an example of a battery monitoring circuit shown in FIG. 1.

FIG. 1 shows a block diagram of a battery monitoring circuit for configuring a battery monitoring module according to an example embodiment, and FIG. 2 shows a circuit diagram of an example of a battery monitoring circuit shown in FIG. 1.

Referring to FIG. 1 and FIG. 2, a battery module 10 may include a plurality of cells 11 connected to each other in series and/or in parallel.

A battery monitoring circuit 20 may be electrically connected to the battery module 10, and may detect, e.g., a cell voltage, a module voltage, and a temperature of respective cells 11 in the battery module 10. The battery monitoring circuit 20 may perform a cell balancing function on the cells 11 included in the battery module 10.

The battery monitoring circuit 20 may include a measuring interface 21, a balancing circuit 22, and an analog front end integrated circuit (AFE IC) 23. In an implementation, a plurality of measuring interfaces 21 and a respectively plurality of balancing circuits 22 may be provided, e.g., the measuring interfaces 21 and the balancing circuits 22 may be provided on a per-cell basis.

The measuring interface 21 may be connected between a corresponding cell 11 and a voltage measuring input terminal Cin of the AFE IC 23 to provide a voltage measuring path P1 of the corresponding cell 11. The measuring interface 21 may include a filter resistor Rf including a first terminal electrically connected to the corresponding cell 11 and a second terminal electrically connected to the voltage measuring input terminal Cin of the AFE IC 23.

The balancing circuit 22 may be connected between the corresponding cell 11 and the balancing terminal Bin of the AFE IC 23 to provide a discharge path P2 for balancing of the corresponding cell 11. The balancing circuit 22 may include a balancing resistor Rb including a first terminal electrically connected to the corresponding cell 11 and a second terminal electrically connected to the balancing terminal Bin of the AFE IC 23. A balancing switch for controlling a current flow of the discharge path P2 for balancing may be included in the AFE IC 23.

In general, if a measuring interface and a balancing circuit are connected to a same cell through a same wire, the accuracy of a cell voltage measurement may be degraded during cell balancing due to a voltage drop or a voltage fluctuation in the common wire. One approach for addressing this issue would be to stop cell voltage measurements for a section of the battery module in which cell balancing is being performed, and only performing cell voltage measurements for a section of the battery module in which cell balancing is not being performed. In contrast, according to the present example embodiment, cell voltage measurement may be performed with improved accuracy during cell balancing, and an influence applied to the voltage measuring path P1 by the discharge path P2 for cell balancing may be minimized by physically separating a signal line (or wire) for electrically connecting between the cell 11 and the measuring interface 21, and a signal line (or wire) for electrically connecting the cell 11 and the balancing circuit 22, from each other. Thus, as shown in FIG. 2 and FIG. 3, the signal line L1 (which is connected between the conductive pad CP combined to an electrode of the cell 11 and the resistor Rf of the measuring interface 21) is physically separated from the signal line L2 (which is connected between the conductive pad CP and the balancing resistor Rb of the balancing circuit 22).

FIG. 3 shows a cross-sectional view of a printed circuit board of a battery monitoring module with respect to a line A-B of FIG. 4A, and FIG. 4A to FIG. 4D show plan views of a printed circuit board of a battery monitoring module for respective layers according to an example embodiment.

The battery monitoring module according to the present example embodiment includes a printed circuit board on which the above-described battery monitoring circuit 20 is mounted. An example embodiment in which the signal line L1 (electrically connecting the cell 11 to the measuring interface 21) is physically separated from the signal line L2 (electrically connecting between the cell 11 and the balancing circuit 22) on the printed circuit board will now be described with reference to FIG. 3, and FIG. 4A to FIG. 4D.

Figure 4A:
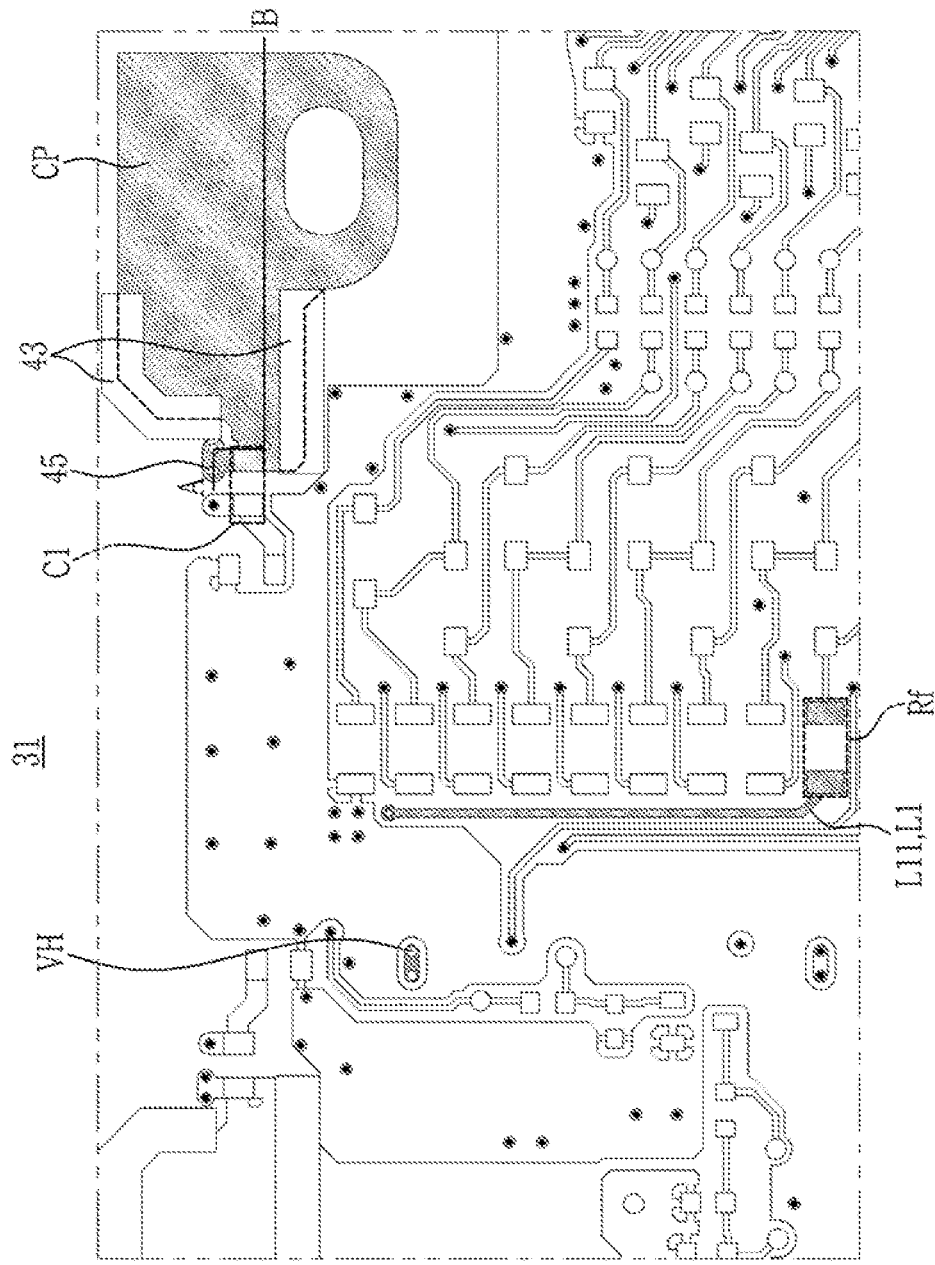

Referring to FIG. 3, and FIG. 4A to FIG. 4D, a printed circuit board 30 that includes the battery monitoring circuit 20 may be a multi-layered board, and may be configured with, e.g., a first layer 31, a second layer 32, a third layer 33, and fourth layer 34. FIG. 4A illustrates an example of the first layer 31. FIG. 4B illustrates an example of the second layer 32. FIG. 4C illustrates an example of the third layer 33. FIG. 4D illustrates an example of the fourth layer 34.

The conductive pad CP, to which an electrode (e.g., a positive electrode) of the corresponding cell 11 is connected, may be disposed on the first layer 31 of the printed circuit board 30.

The conductive pad CP may be combined to the electrode of the corresponding cell 11 by, e.g., a bolt assembly, welding, or soldering. The conductive pad CP may be combined to the electrode of the corresponding cell 11 by using as, e.g., an adhesive member such as silicone or an adhesive tape. The conductive pad CP may be combined to the electrode of the corresponding cell 11 by, e.g., a combining member such as a bus bar, etc.

In general, moisture (or water droplets) may be generated by external exposure or a potential difference with a ground in a region where a conductive pad is positioned on a printed circuit board. Such moisture may generate an electrochemical reaction with a copper component configuring a wire of the printed circuit board, and may work as a factor in causing the wire to be corroded. The corrosion of the wire may increase resistance of the wire or may short-circuit the wire, which may cause a false operation of the battery monitoring circuit. According to the present example embodiment, regarding the printed circuit board 30 according to the present example embodiment, to prevent the conductive pad CP from being corroded by external exposure thereof, an anticorrosive member such as a photo solder resist PSR 44 or a silkscreen coating film 43 is applied to a predetermined region of the conductive pad CP. The silkscreen coating film is a coating film applied by a silkscreen printing way.

When the PSR 44 is applied to prevent the conductive pad CP from being exposed to the outside, it may not be possible to completely prevent an edge of the PSR 44 or a corner of a via hole VH from being exposed. Therefore, the silkscreen coating film 43 may be applied (or coated) to at least part of the edge of the conductive pad CP, to thus prevent the edge of the conductive pad CP from being exposed to the outside. For example, the silkscreen coating film 43 may be applied (or coated) to an edge of the conductive pad CP and a region of the PSR 44 contacting the same.

In an implementation, a hole plugging scheme for blocking the via hole VH from the outside by filling the via hole VH with a filler made of an insulating material may be used to prevent the edge of the via hole VH on the printed circuit board 30 from being exposed to an outside and being corroded. In an implementation, a PSR may be applied (or coated) to the via hole VH filled according to the hole plugging scheme.

The filter resistor Rf included in the measuring interface 21 of the battery monitoring circuit 20 may be positioned on the first layer 31 of the printed circuit board 30, and the first signal line L1 electrically connecting the filter resistor Rf and the conductive pad CP may be positioned on the first layer 31 and the third layer 33 of the printed circuit board 30.

A partial wire L12 of the first signal line L1 may be positioned on the third layer 33 and electrically connected to the conductive pad CP of the first layer 31 through the via hole 45. A partial wire L11 may be positioned on the first layer 31 and electrically connected to the filter resistor Rf on the same layer. In the present example embodiment, the first signal lines L11 and L12 that are respectively positioned on the third layer 33 and the first layer 31 may be electrically connected to each other through the via hole VH.

The balancing resistor Rb included in the balancing circuit 22 of the battery monitoring circuit 20 may be provided on the fourth layer 34 of the printed circuit board 30. The second signal line L2 that electrically connects the balancing resistor Rb and the conductive pad CP may be provided on the third layer 33 of the printed circuit board 30. The second signal line L2 may include a first end electrically connected to the conductive pad CP of the first layer 31 through the via hole 45, and a second end connected to the balancing resistor Rb on the fourth layer 34 through the via hole VH.

As shown in FIG. 3 and FIG. 4C, the first signal line L1 providing the voltage measuring path P1 and the second signal line L2 providing the discharge path P2 for balancing do not use additional signal lines but are electrically connected to the conductive pad CP through the via hole 45, and they are positioned to be physically separated from each other in the battery monitoring circuit 20. Accordingly, the influence of the discharge path P2 for cell balancing on the voltage measuring path P1 may be minimized. Thus, a cell voltage measurement may be accurately performed simultaneously with performing cell balancing.

According to an example embodiment, an electrostatic discharge (ESD) capacitor may be used to protect the battery monitoring circuit 20 from static electricity input from the outside through the conductive pad CP. In general, if an ESD capacitor is separately disposed from the signal lines while the signal lines are also physically separated from each other, a unit cost of the battery monitoring module may increase. According to the present example embodiment, the ESD capacitor may be positioned between a first point (where the first signal line L1 is combined to the second signal line L2 on the conductive pad CP) and a second point (to which the electrode of the corresponding cell 11 is combined). This arrangement may thus avoid an increase in the unit cost of the battery monitoring module because of separation of the first signal line L1 and the second signal line L2.

FIG. 5 shows an example coupling of an ESD capacitor to a conductive pad on a printed circuit board of a battery monitoring module according to an example embodiment. FIG. 5 is a magnified part of the plan view of FIG. 4A.

Referring to FIG. 5, the conductive pad CP may include a first part 61 to which the cell electrode is combined, a third part 63 to which the ESD capacitor C1 is combined, and a second part 62 for connecting the first part 61 and the third part 63.

The first part 61 represents a pad portion to which the electrode of the corresponding cell 11 is combined. As shown in FIG. 3, the pad portion may include the conductive material 42 such as tin plated on the copper wire 41 to enable electrical coupling.

The second part 62 represents a connector of the first part 61 and the third part 63. The second part 62 may have a funnel shape (W2<W1) in plan view, wherein a width gradually reduces toward the third part 63 from the first part 61. This may improve ESD preventing performance by allowing static electricity input from the outside through the first part 61 of the conductive pad CP to be efficiently transmitted to the third part 63 connected to the ESD capacitor C1.

The ESD capacitor C1 may be connected to the third part 63, in which the via hole 45 (in which the first and second signal lines L1 and L2 are coupled) may be positioned. The ESD capacitor C1 may be connected between the via hole 45 (to which the first and second signal lines L1 and L2 are connected) and the second part 62 on the third part 63. This may allow the first and second signal lines L1 and L2 to use the ESD capacitor C1 in common, thereby reducing the unit cost of the battery monitoring module.

According to an example embodiment, for rigidity of the ESD capacitor against external impact, two ESD capacitors C1 and C2 may be disposed to be orthogonal to each other. For example, a first terminal of the first capacitor C1 may be electrically connected to the third part 63 of the conductive pad CP, a second terminal of the first capacitor C1 and a first terminal of the second capacitor C2 may be electrically connected to each other, and a second terminal of the second capacitor C2 may be grounded.

According to the present example embodiment, as shown in FIG. 5, the edge of the conductive pad CP may be prevented from being exposed to the outside by silkscreen coating film 43 disposed on at least part of the edge on the second and third parts 62 and 63 of the conductive pad CP. Here, the first part 61 of the conductive pad CP represents a part to which the cell electrode of the corresponding cell 11 is combined, and thus may not be covered by the silkscreen coating film 43.

By way of summation and review, according to strengthening of environmental regulations including $CO_2$ regulations, interest in environmentally-friendly vehicles has been increasing. Accordingly, vehicle companies have been actively researching and developing pure electrical vehicles and hydrogen vehicles as well as hybrid and plug-in hybrid vehicles. A battery pack for storing electrical energy obtained from various energy sources may be used in environmentally-friendly vehicles. A battery pack may include a plurality of battery modules connected in series with each other to supply high voltage electrical energy. Each of the battery modules may include a plurality of cells connected in series and/or in parallel with each other. A battery management system may be mounted in the battery pack to protect the battery pack by detecting voltages, temperatures, and charge/discharge currents of each cell or battery module so as to detect whenever the battery pack is in an abnormal state.

A cell balancing function, which compensates a voltage deviation between cells while monitoring the voltage of each of the cells constituting the battery module, may be performed by the battery management system. The battery management system may include an analog front end (AFE) IC that performs cell voltage monitoring and cell balancing functions for cell balancing, for each battery module, and a battery controller serving as an upper-level controller communicates with each AFE IC to control the cell balancing of each battery module.

In general, a cell voltage monitoring path and a cell balancing path of the AFE IC may be designed to use wires in common, but when the cell voltage is measured while cell balancing is performed, measuring accuracy may be deteriorated, with a drawback that the cell voltage is thus measured only for a section in which no cell balancing is performed.

As described above, embodiments may provide an battery monitoring module that enables precise cell voltage measuring during cell balancing.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

DESCRIPTION OF SYMBOLS

10: battery module
11: cell
20: battery monitoring circuit
21: measuring interface
22: balancing circuit
23: AFE IC
30: printed circuit board
41: copper wire
42: conductive material
43: silkscreen coating film
44: PSR
45, VH: via hole
61: first part of conductive pad
62: second part of conductive pad
63: third part of conductive pad
CP: conductive pad
C1, C2: ESD capacitor
Rf: filter resistor
Rb: balancing resistor
L1, L11, L12: first signal line
L2: second signal line
P1: voltage measuring path
P2: discharge path for balancing

What is claimed is:

1. A battery monitoring module, comprising:
   a printed circuit board including a first signal line, a second signal line, and a conductive pad, the conductive pad being configured to be connected to an electrode of a cell;
   an integrated circuit on the printed circuit board, the integrated circuit being configured to measure a cell voltage at the cell and to control cell balancing of the cell;
   a measuring interface on the printed circuit board and connected between the conductive pad and the integrated circuit, the measuring interface providing a voltage measuring path for the cell; and
   a balancing circuit on the printed circuit board and connected between the conductive pad and the integrated circuit, the balancing circuit providing a discharge path for the cell during the cell balancing,
   wherein:
   the first signal line electrically connects the conductive pad to the measuring interface, and
   the second signal line is physically separated from the first signal line, and electrically connects the conductive pad to the balancing circuit.

2. The battery monitoring module of claim 1, further comprising an electrostatic discharge capacitor on the printed circuit board and electrically connected to the conductive pad.

3. The battery monitoring module of claim 2, wherein:
   the conductive pad includes a first part connected to an electrode of the cell, a second part, and a third part to which the electrostatic discharge capacitor is connected, and
   the second part connects the first part and the third part, and has a shape in which a width of the second part gradually reduces in a direction from the first part toward the third part.

4. The battery monitoring module of claim 3, wherein:
   the first and second signal lines are combined with a portion of the third part, and
   the electrostatic discharge capacitor is provided on the printed circuit board between the second part and the portion of the third part where the first and second signal lines are connected.

5. The battery monitoring module of claim 3, wherein the printed circuit board further includes an anticorrosive member positioned on at least part of edges of the second part and the third part.

6. The battery monitoring module of claim 5, wherein the anticorrosive member include a coating film formed by a silkscreen printing way.

7. The battery monitoring module of claim 1, wherein the measuring interface includes a resistor on the printed circuit board, the resistor including a first terminal electrically connected to the first signal line, and a second terminal connected to a voltage measuring input terminal of the integrated circuit.

8. The battery monitoring module of claim 1, wherein the balancing circuit includes a balancing resistor for discharging electrical energy of the cell, the balancing resistor being on the printed circuit board and including a first terminal electrically connected to the second signal line.

9. The battery monitoring module of claim 1, wherein:
   the printed circuit board includes at least one via hole electrically connecting at least two of the conductive pad, the integrated circuit, the measuring interface, the balancing circuit, the first signal line, and the second signal line, and
   the via hole is filled with a filler made of an insulating material by a hole plugging operation.

* * * * *